United States Patent
Fujikura (10) Patent No.: US 10,066,292 B2
(45) Date of Patent: Sep. 4, 2018

(54) SEMICONDUCTOR MANUFACTURING DEVICE AND SEMICONDUCTOR MANUFACTURING METHOD

(71) Applicant: SUMITOMO CHEMICAL COMPANY, LIMITED, Tokyo (JP)

(72) Inventor: Hajime Fujikura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/508,421

(22) PCT Filed: Jun. 24, 2015

(86) PCT No.: PCT/JP2015/068150
§ 371 (c)(1),
(2) Date: Mar. 2, 2017

(87) PCT Pub. No.: WO2016/035428
PCT Pub. Date: Mar. 10, 2016

(65) Prior Publication Data
US 2017/0283944 A1    Oct. 5, 2017

(30) Foreign Application Priority Data

Sep. 3, 2014   (JP) .................................. 2014-179387

(51) Int. Cl.
*C30B 25/14*     (2006.01)
*C23C 16/44*    (2006.01)
(Continued)

(52) U.S. Cl.
CPC ............ *C23C 16/4401* (2013.01); *B08B 5/02* (2013.01); *C23C 16/455* (2013.01);
(Continued)

(58) Field of Classification Search
CPC ......... C30B 23/02; C30B 23/06; C30B 25/08; C30B 25/14
See application file for complete search history.

(56) References Cited

U.S. PATENT DOCUMENTS 4,081,313 A * 3/1978 McNeilly .............. C30B 25/105
                                                              117/103
8,778,078 B2 * 7/2014 Scholz .................... C30B 25/00
                                                               117/84
(Continued)

FOREIGN PATENT DOCUMENTS

JP   2-58325 A   2/1990
JP   6-188199 A  7/1994
(Continued)

OTHER PUBLICATIONS

International Search Report issued in PCT/JP2015/068150 (PCT/ISA/210), dated Sep. 15, 2015.
(Continued)

*Primary Examiner* — Robert M Kunemund
(74) *Attorney, Agent, or Firm* — Birch, Stewart, Kolasch & Birch, LLP (57) ABSTRACT

There is provided a semiconductor manufacturing device, including: a processing vessel; a partition wall that divides at least a part of a space in the processing vessel into a growth section and a cleaning section; a substrate holding member disposed in the growth section; a source gas supply system that supplies a source gas into the growth section; a cleaning gas supply system that supplies a cleaning gas into the cleaning section; and a heater that heats the growth section and the cleaning section.

8 Claims, 2 Drawing Sheets

(51) Int. Cl.
　　　*C23C 16/46* (2006.01)
　　　*C23C 16/458* (2006.01)
　　　*C23C 16/455* (2006.01)
　　　*C30B 25/16* (2006.01)
　　　*C30B 29/40* (2006.01)
　　　*H01L 21/67* (2006.01)
　　　*H01L 21/687* (2006.01)
　　　*H01L 21/02* (2006.01)
　　　*B08B 5/02* (2006.01)

(52) U.S. Cl.
　　　CPC ............ *C23C 16/458* (2013.01); *C23C 16/46* (2013.01); *C30B 25/14* (2013.01); *C30B 25/165* (2013.01); *C30B 29/40* (2013.01); *H01L 21/0254* (2013.01); *H01L 21/0262* (2013.01); *H01L 21/67109* (2013.01); *H01L 21/68714* (2013.01); *H01L 21/02543* (2013.01); *H01L 21/02546* (2013.01)

(56) References Cited

U.S. PATENT DOCUMENTS

| | | |
|---|---|---|
| 2007/0148920 A1 | 6/2007 | Kasai et al. |
| 2013/0043442 A1 | 2/2013 | Konno et al. |

FOREIGN PATENT DOCUMENTS

| | | |
|---|---|---|
| JP | 2003-27242 A | 1/2003 |
| JP | 2004-281955 A | 10/2004 |
| JP | 2007-35855 A | 2/2007 |
| JP | 2007-197302 A | 8/2007 |
| JP | 2013-58741 A | 3/2013 |

OTHER PUBLICATIONS

English Translation of International Preliminary Report on Patentability and Written Opinion of the International Searching Authority (Forms PCT/IB/338, PCT/IB/373 and PCT/ISA/237) dated Mar. 16, 2017, for International Application No. PCT/JP2015/068150.

Notification of Reasons for Refusal issued in corresponding Japanese Application No. 2014-179387 dated May 1, 2018, with English translation.

* cited by examiner

SEMICONDUCTOR MANUFACTURING DEVICE AND SEMICONDUCTOR MANUFACTURING METHOD

BACKGROUND

Technical Field

The present invention relates to a semiconductor manufacturing device and a semiconductor manufacturing method.

Description of Related Art

A so-called hydride vapor phase epitaxy (HVPE) method is known as a method for making a crystal growth of Ga-based compound semiconductors such as gallium arsenide (GaAs), gallium phosphide (GaP) and gallium nitride (GaN), etc., at a high speed (for example, see patent document 1). In the HVPE method, GaCl gas or $GaCl_3$ gas produced by bringing a chlorine-based gas such as hydrogen chloride (HCl) gas or chlorine ($Cl_2$), etc., gas into contact with a metal Ga of a high temperature (about 300° C. to 800° C.) placed in a growth device, is used as a group III raw material gas (group III source gas).

The HVPE method is used for growing a thick film on a substrate or manufacturing a free-standing substrate because a growth rate reaches several 100 μm/h to several mm/h. As a disadvantage of the HVPE method, a growth thickness is remarkably as large as several 100 μm/h to several mm/h as compared with several μm of a metal organic vapor phase epitaxy (MOVPE) method, and therefore semiconductors are also thickly deposited on a nozzle, a substrate tray and the like, and such deposited semiconductors are evaporated and scattered in subsequent growth, which is likely to cause a surface defect.

Therefore, usually, after taking out the substrate from the device after growth, the device is brought into a high-temperature state again without setting the substrate, and an inside of a furnace is etched with a chlorine-based gas to thereby perform cleaning, so-called baking for removing the semiconductors deposited in the device. In this baking step, the growth device is used for a long time, thereby causing a reduction in productivity in the manufacture using the HVPE method.

There is also a method for improving the productivity of the HVPE device itself by detaching a jig with semiconductors deposited thereon after growth, and performing cleaning using a dedicated baking device separately from the growth device. However, in this case, cost and labor are required for introduction, operation and maintenance of the baking device.

PRIOR ART DOCUMENT

Patent Document

Patent document 1: Japanese Patent Laid Open Publication No. 2013-58741

SUMMARY OF THE INVENTION

Problem to be Solved by the Invention

An object of the present invention is to provide a semiconductor manufacturing technique capable of efficiently performing cleaning for removing deposits which are deposited on members.

Means for Solving the Problem

According to an aspect of the present invention, there is provided a semiconductor manufacturing device, including:
a processing vessel;
a partition wall that divides at least a part of a space in the processing vessel into a growth section and a cleaning section;
a substrate holding member disposed in the growth section;
a source gas supply system that supplies a source gas into the growth section;
a cleaning gas supply system that supplies a cleaning gas into the cleaning section; and
a heater that heats the growth section and the cleaning section.

According to another aspect of the present invention, there is provided a semiconductor manufacturing method, using a semiconductor manufacturing device including:
a processing vessel;
a partition wall that divides at least a part of a space in the processing vessel into a growth section and a cleaning section;
a substrate holding member disposed in the growth section;
a source gas supply system that supplies a source gas into the growth section;
a cleaning gas supply system that supplies a cleaning gas into the cleaning section; and
a heater that heats the growth section and the cleaning section,
the method including the steps of:
supplying the source gas from the source gas supply system to a substrate held by the substrate holding member disposed in the growth section to grow semiconductors on the substrate, and simultaneously supplying the cleaning gas from the cleaning gas supply system to a cleaning member disposed in the cleaning section to remove the semiconductors deposited on the cleaning member, in a state where the growth section and the cleaning section are heated by the heater.

Advantage of the Invention

Since the partition wall divides the inside of the processing vessel into the growth section and the cleaning section, a flow of the source gas supplied into the growth section and a flow of the cleaning gas supplied into the cleaning section can be separated from each other, and a film forming processing in the growth section and a cleaning processing in the cleaning section can be performed simultaneously.

DETAILED DESCRIPTION OF THE INVENTION

Hereinafter, a semiconductor manufacturing device and a semiconductor manufacturing method according to an embodiment of the present invention will be described.

(1) Semiconductor Manufacturing Device

First, the semiconductor manufacturing device according to an embodiment will be described, with reference to FIG. 1(A) to FIG. 1(C). FIG. 1(A) is a vertical sectional view of the semiconductor manufacturing device according to an embodiment. FIG. 1(B) is a horizontal sectional view taken along the line A-A of FIG. 1(A). FIG. 1(C) is a sectional view (vertical sectional view) showing an example of a configuration of a holder for holding a substrate.

As described hereafter, the semiconductor manufacturing device of this embodiment is configured to perform a cleaning processing for removing semiconductor deposits from a cleaning member, simultaneously with performing a semiconductor crystal growth processing (film forming processing) on a substrate by a hydride vapor phase epitaxy (HVPE) method. For the sake of avoiding complication, "cleaning for removing semiconductor deposits" may be expressed as "cleaning of semiconductor deposits" in some cases. "Semiconductor deposits" to be removed are simply referred to as "deposits" or simply "semiconductors" in some cases.

In this embodiment, as the semiconductors to be grown and cleaned, Ga-based compound semiconductors (Ga-containing compound semiconductors) such as gallium arsenide (GaAs), gallium phosphide (GaP) and gallium nitride (GaN), etc., which are group III-V compound semiconductors are exemplified. More specifically, explanation will be given hereafter, using GaN as an example.

(Reaction Furnace)

An HVPE device 1 as a semiconductor manufacturing device according to an embodiment includes a reaction furnace 10 formed in a cylindrical shape for example, with a heat-resistant material such as quartz glass, etc., as a processing vessel. Both edges of the reaction furnace 10 are closed by flanges 11a and 11b which are made of a metal material such as stainless steel, etc. The flanges 11a and 11b are attached to the reaction furnace 10 detachably as required. An opening portion at an edge of the reaction furnace 10 can be opened and closed freely by detaching or attaching the flanges 11a and 11b.

Figure 1:
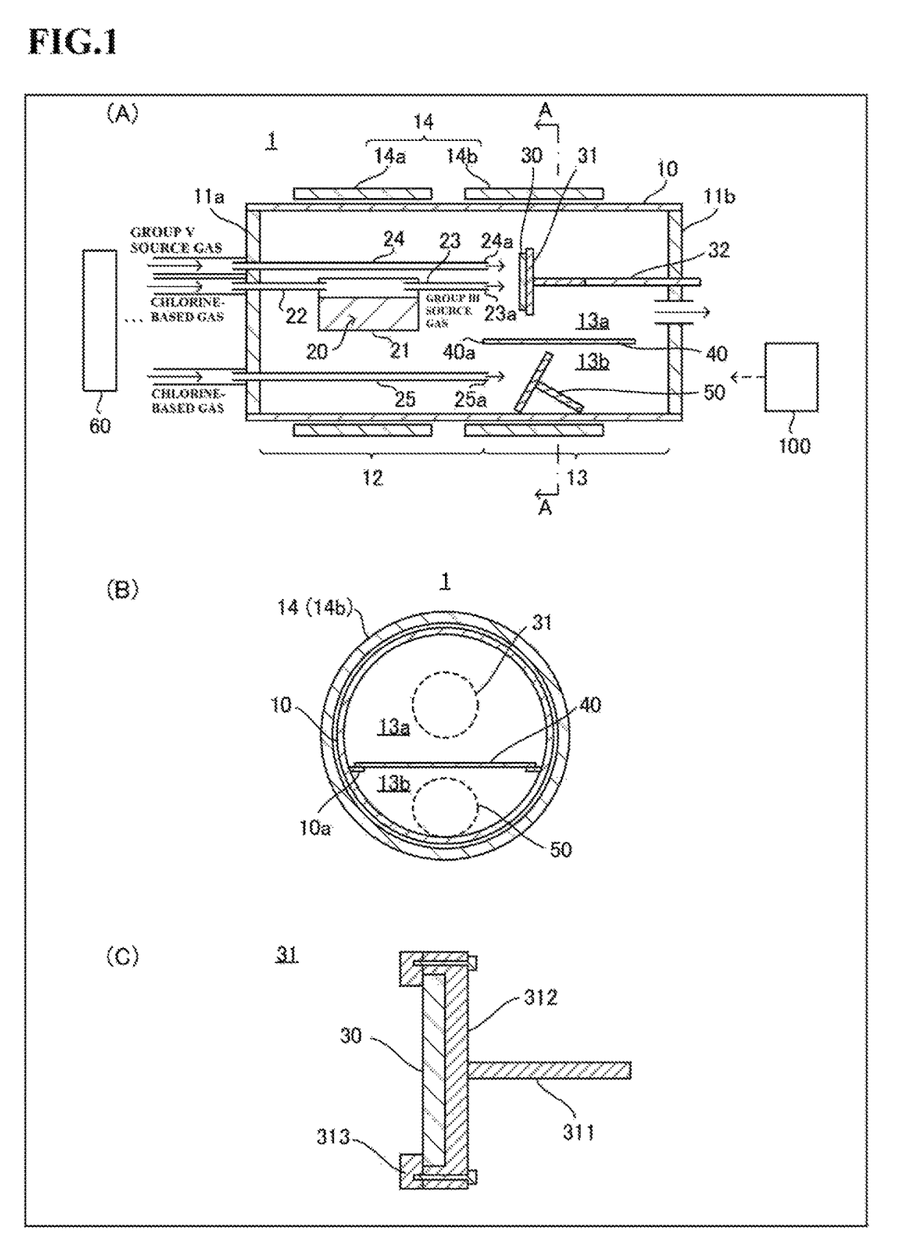
FIG. 1(A) is a vertical sectional view of a semiconductor manufacturing device according to an embodiment of the present invention.
FIG. 1(B) is a horizontal sectional view taken along the line A-A of FIG. 1(A).
FIG. 1(C) is a sectional view (vertical sectional view) showing an example of a configuration of a holder for holding a substrate.

In the reaction furnace 10, a gas flow is formed from one end side toward the other end side of the reaction furnace 10 (from the flange 11a side toward the flange 11b side in an example shown in FIG. 1 (A)), as described in detail later. Hereinafter, an upstream side and a downstream side of the gas flow may be simply referred to as an upstream side and a downstream side, respectively.

An inside of the reaction furnace 10 is divided into an upstream section 12 which is a space on the upstream side and a downstream section 13 which is a space on the downstream side with respect to the upstream section 12. The upstream section 12 is configured as a gas supply section 12 which is a space in which a gas supply system described below is disposed.

The downstream section 13 is divided into the growth section 13a and the cleaning section 13b interposing the partition wall 40 provided in the reaction furnace 10 in a direction crossing a gas flow direction, more specifically, in a vertical direction for example. One side of the downstream section 13 interposing the partition wall 40, more specifically, for example an upper side thereof is configured as a growth section 13a which is a space for performing film formation on the substrate 30, and the other side of the downstream section 13 interposing the partition wall 40, more specifically for example a lower side thereof is configured as a cleaning section (baking section) 13b which is a space for performing cleaning (so-called baking) for removing deposits from a cleaning member 50.

Regarding a position in the gas flow direction, a boundary between the upstream section 12 and the downstream section 13 is defined by an upstream side end 40a of the partition wall 40, and an upstream side space with respect to the upstream side end 40a of the partition wall 40 is defined as the upstream section 12, and a downstream side space with respect to the upstream side end 40a of the partition wall 40 is defined as the downstream section 13. It is not necessary for the upstream section 12 and the downstream section 13 to be partitioned by a structure.

(Heater)

A heater 14 for heating the inside of the reaction furnace 10 is provided on an outer circumferential side of the reaction furnace 10. The heater 14 has an upstream side heater 14a disposed around the upstream section (gas supply section) 12 and a downstream side heater 14b disposed around the downstream section 13 (the growth section 13a and the cleaning section 13b). The upstream side heater 14a and the downstream side heater 14b are configured such that the gas supply section 12, the growth section 13a and the cleaning section 13b can be heated to independent temperatures (for example, the temperature of the gas supply section 12 is set to about 850° C., the temperatures of the growth section 13a and the cleaning section 13b are set to about 1000° C.), respectively.

(Gas Supply Section)

In the gas supply section 12, a storage vessel 21 made of a heat-resistant material such as quartz glass, etc., for storing a metal raw material 20 is disposed. The storage vessel 21 is configured as a sealed vessel in which gas leakage or the like does not occur except for pipes 22 and 23 described later, so that the metal raw material 20 is stored in this sealed vessel.

The metal material 20 stored in the storage vessel 21 is used as a group III raw material, which is a base of a group III source gas supplied to the substrate 30. Specifically, for example gallium (Ga) is used as the metal raw material 20. Since Ga has a relatively low melting point of 29.8° C., Ga is present in the storage container 21 in a molten state (in other words, liquid state).

A pipe 22 made of a heat-resistant material such as quartz glass, etc., is connected to the upstream side of the storage vessel 21. An upstream side end portion of the pipe 22 penetrates the flange 11a and communicates with an outside of the reaction furnace 10 and is connected to a supply source of a chlorine-based gas (chlorine-containing gas). For example, hydrogen chloride (HCl) can be used as the chlorine-based gas supplied to the pipe 22. A downstream side end portion of the pipe 22 is connected to the storage vessel 21. The chlorine-based gas can be supplied into the storage vessel 21 via the pipe 22.

For example, when Ga is used as the metal raw material 20 and HCl gas is used as the chlorine-based gas, Ga and HCl gas react with each other under moderate heating conditions by the upstream side heater 14a in the storage vessel 21, and gallium chloride (GaCl) gas which is a metal chloride gas (chloride source gas) is generated as the group III source gas. A chloride source gas generating section is configured including the storage vessel 21 and the pipe 22. The chlorine-based gas supplied to the pipe 22 may also be referred to as a chlorine-based gas for a raw material in some cases.

A pipe 23 made of a heat-resistant material such as quartz glass, etc., is connected to the downstream side of the storage vessel 21. An upstream side end portion of the pipe 23 is connected to the storage vessel 21. The pipe 23 extends in the downstream side toward the growth section 13a. The group III source gas (chloride source gas) generated in the storage vessel 21 can be supplied into the growth section 13a via the pipe 23.

In the gas supply section 12, a pipe 24 made of a heat-resistant material such as quartz glass, etc., is disposed so as to be parallel to the pipes 22 and 23. An upstream side end portion of the pipe 24 penetrates the flange 11a and communicates with the outside of the reaction furnace 10 and is connected to a supply source of a group V source gas. As the group V source gas, for example, ammonia ($NH_3$) gas can be used. The pipe 24 extends in the downstream side toward the growth section 13a. The group V source gas can be supplied into the growth section 13a via the pipe 24.

The group III source gas and the group V source gas are source gases for growing semiconductors. A group III source gas supply system is configured including the storage vessel 21 and the pipes 22, 23. A group V source gas supply system is configured including the pipe 24. A source gas supply system is configured including the group III source gas supply system and the group V source gas supply system. The chloride source gas generating section is included in the group III source gas supply system and is included in the source gas supply system.

A pipe 25 made of a heat resistant material such as quartz glass, etc., is further disposed in the gas supply section 12 so as to be parallel to the pipes 22, 23 and the pipe 24. An upstream side end portion of the pipe 25 penetrates the flange 11a and communicates with the outside of the reaction furnace 10 and is connected to a supply source of the chlorine-based gas. As the chlorine-based gas supplied to the pipe 25, for example a gas of the same kind as the chlorine-based gas for the raw material supplied to the pipe 22, for example HCl gas can be used. The pipe 25 extends in the downstream side toward the cleaning section 13b. The chlorine-based gas as a cleaning gas can be supplied into the cleaning section 13b via the pipe 25. The chlorine-based gas supplied to the pipe 25 may also be referred to as a chlorine-based gas for cleaning in some cases.

A cleaning gas supply system is configured including the pipe 25. A gas supply system is configured including the source gas supply system and the cleaning gas supply system.

Gas supply sources of each kind of gas used in the HVPE device 1 are collectively shown as a gas supply source 60. When the same kind of gas as the chlorine-based gas for the raw material is used as the chlorine-based gas for cleaning, the pipe 25 is also commonly connected to the supply source of the chlorine-based gas to which the pipe 22 is connected. In other words, the cleaning gas supply system is commonly connected to the supply source of the chlorine-based gas used in the chloride source gas generating section.

By providing the pipes 22 to 25 of the gas supply system, in the reaction furnace 10, a gas flow from the gas supply section 12 side toward the growth section 13a side or the cleaning section 13b side (a gas flow from the flange 11a side toward the flange 11b side) is formed. An exhaust port for exhausting the gas in the reaction furnace 10 is provided on the downstream side flange 11b. Formation of the gas flow from the flange 11a side toward the flange 11b side can be ensured by exhaust from the exhaust port provided on the flange 11b.

(Growth Section)

In the growth portion 13a, a holder 31 made of a heat-resistant material such as carbon, etc., is disposed as a substrate holding member. The substrate 30 serving as a base for film formation is held by the holder 31. The holder 31 is detachably attached to a rotary shaft 32 extending along a cylindrical axis direction of the reaction furnace 10 and holds the substrate 30 so that it can be rotated at a predetermined speed around the rotary shaft 32.

As the substrate 30, for example a sapphire substrate is used. The substrate 30 may include some layer (for example, AlN buffer layer or GaN buffer layer) which is already formed as a base layer for film formation.

FIG. 1(A) schematically shows the holder 31 in a state of holding the substrate 30. FIG. 1(C) shows a more specific configuration example of the holder 31 in a state of holding the substrate 30. The holder 31 is configured including an attachment portion 311 to the rotary shaft 32, a tray portion 312 in which the substrate 30 is housed, and a substrate pressing portion 313. As an attachment configuration of the attachment portion 311, for example a configuration of inserting the attachment portion 311 into the end portion of the rotary shaft 32 can be mentioned.

In a state where the substrate 30 is housed in the tray portion 312, a donut plate-like substrate pressing portion 313 is attached onto an edge of the tray portion 312 to press down an edge portion of the substrate 30, thereby making it possible to hold the substrate 30 by the holder 31. In a state where the substrate 30 is held by the holder 31, film formation can be performed on the surface of the substrate 30 exposed in an opening of the substrate pressing portion 313. After the film formation, the substrate 30 can be taken out from the holder 31 by detaching the substrate pressing portion 313.

The rotary shaft 32 is attached to the flange 11b so as to penetrate the flange 11b. As a result thereof, the rotary shaft 32, the holder 31 attached to the rotary shaft 32, and the substrate 30 held by the holder 31 can be set in the reaction furnace 10 or taken out it from the reaction furnace 10, along with attachment and detachment of the flange 11b. That is, the opening portion at the flange 11b side edge of the reaction furnace 10 functions as a loading/unloading port for the substrate 30 and the like. Then, in a state where the flange 11b is detached from the reaction furnace 10, it becomes possible to attach and detach the holder 31 to/from the rotary shaft 32, and attach and detach the substrate 30 to/from the holder 31.

Tip portions (nozzles) 23a, 24a of the pipes 23, 24 of the source gas supply system are disposed at positions facing the substrate 30 so that the source gas is supplied to the substrate 30 held by the holder 31. The nozzles 23a, 24a are detachably attached to body portions of the pipes 23 and 24, respectively. The nozzles 23a and 24a are made of a heat resistant material such as quartz glass, etc. It is preferable that the nozzles 23a and 24a are made of the same heat resistant material as the body portions of the pipes 23 and 24 respectively with the same degree of thermal expansion, from a viewpoint of preventing damage.

By supplying the source gas from the source gas supply system, semiconductors are grown on the substrate 30. With such a growth, the semiconductors are deposited on the surfaces of the holder 31, the nozzles 23a, 24a, and the like, which are members disposed in the vicinity of the substrate 30.

The semiconductors deposited on a member disposed in the reaction furnace 10 are evaporated and scattered in subsequent film forming processing, which causes a defect in a film to be grown on the substrate 30. Therefore, it is necessary to perform cleaning (baking) of removing deposits, to the member on which the semiconductors are deposited.

In the HVPE device 1 of this embodiment, regarding the member (member becoming the cleaning member 50) such as the holder 31 and the nozzles 23a and 24a of the source gas supply system and the like disposed at a position in the reaction furnace 10 where the semiconductors are deposited, and desired to be cleaned suitably, a plurality of the same kind of them are prepared in a detachable manner in the reaction furnace 10 so that they can be exchanged. As a result thereof, as described later, the following application may be possible: one of the same kind of cleaned member (already cleaned member) is used for film forming processing, and the other member that requires cleaning (already used member) is subjected to cleaning processing simultaneously with the film forming processing.

(Cleaning Section)

In the cleaning section 13b, an area for setting the cleaning member 50 is secured. More specifically, for example, the cleaning member 50 can be placed on a bottom surface of the reaction furnace 10 of the cleaning section 13b.

A tip portion (nozzle) 25a of the pipe 25 of the cleaning gas supply system is disposed at a position facing the cleaning member 50, so that a cleaning gas is supplied to the cleaning member 50 set in the cleaning section 13b.

For example, the cleaning member 50 is the holder 31, nozzles 23a, 24a or the like attached to the present HVPE device 1, with semiconductors deposited thereon by being used for the previous film forming processing. FIGS. 1(A) and 1(B) exemplify the holder 31 as the cleaning member 50.

A setting manner of the cleaning member 50 is not limited to a manner of directly placing the cleaning member 50 on the bottom surface of the reaction furnace 10, and for example there is also a setting manner using a holding tool capable of holding the cleaning member 50 at a position where the cleaning gas suitably hits.

(Partition Wall)

The partition wall 40 is made of a heat resistant material such as carbon, etc., and formed into a plate shape for example, so that at least a part of the space in the reaction furnace 10 is divided into the growth section 13a and the cleaning section 13b. The partition wall 40 is detachably set in the reaction furnace 10 so that the surface exposed to the growth section 13a side and the surface exposed to the cleaning section 13b side can be reversed (turned over).

For example, by placing the partition wall 40 on a protrusion 10a provided on an inner wall of the reaction furnace 10, the partition wall 40 can be detachably set in the reaction furnace 10 so that the surface can be reversed.

By disposing the partition wall 40 between the flow of the source gas supplied from the source gas supply system toward the growth section 13a and the flow of the cleaning gas supplied from the cleaning gas supply system toward the cleaning section 13b in parallel to the flow of the source gas, the flow of the source gas supplied into the growth section 13a and the flow of the cleaning gas supplied into the cleaning section 13b can be separated from each other so as not to be mixed each other.

The flow of the source gas and the flow of the cleaning gas are parallel to each other, and therefore they are hardly mixed each other to some extent in this state. Therefore, it is not necessary to provide the partition wall that severely divides the inside of the reaction furnace 10 so that the space where the source gas flows and the space where the cleaning gas flows do not communicate with each other.

In order to more reliably separate the flow of the source gas and the flow of the cleaning gas, it is preferable to adopt the following configuration.

Regarding the position in the gas flow direction, preferably the downstream side ends of the pipes 23 and 24 of the source gas supply system coincide with the upstream side end 40a of the partition wall 40 or disposed on a downstream side thereof, and more preferably disposed on the downstream side of the upstream side end 40a of the partition wall 40. In other words, the downstream side ends of the pipes 23 and 24 of the source gas supply system are more preferably disposed so as to enter into the growth section 13a.

Regarding the position in the gas flow direction, preferably the downstream side end of the pipe 25 of the cleaning gas supply system coincides with the upstream side end 40a of the partition wall 40 or disposed on the downstream side thereof, and more preferably disposed on the downstream side of the upstream side end 40a of the partition wall 40. In other words, the downstream side end of the pipe 25 of the cleaning gas supply system is more preferably disposed so as to enter into the growth section 13b.

From a viewpoint that the HVPE device 1 is originally a film forming device, the partition wall 40 is preferably disposed so that the growth section 13a for performing the film forming processing can be secured more widely than the cleaning section 13b for performing the cleaning processing.

(Controller)

A controller 100 controls an operation of supplying each kind of gas to the gas supply system, a heating operation by the heater 14, and the like.

(2) Procedure of a Semiconductor Manufacturing Method

Figure 2:
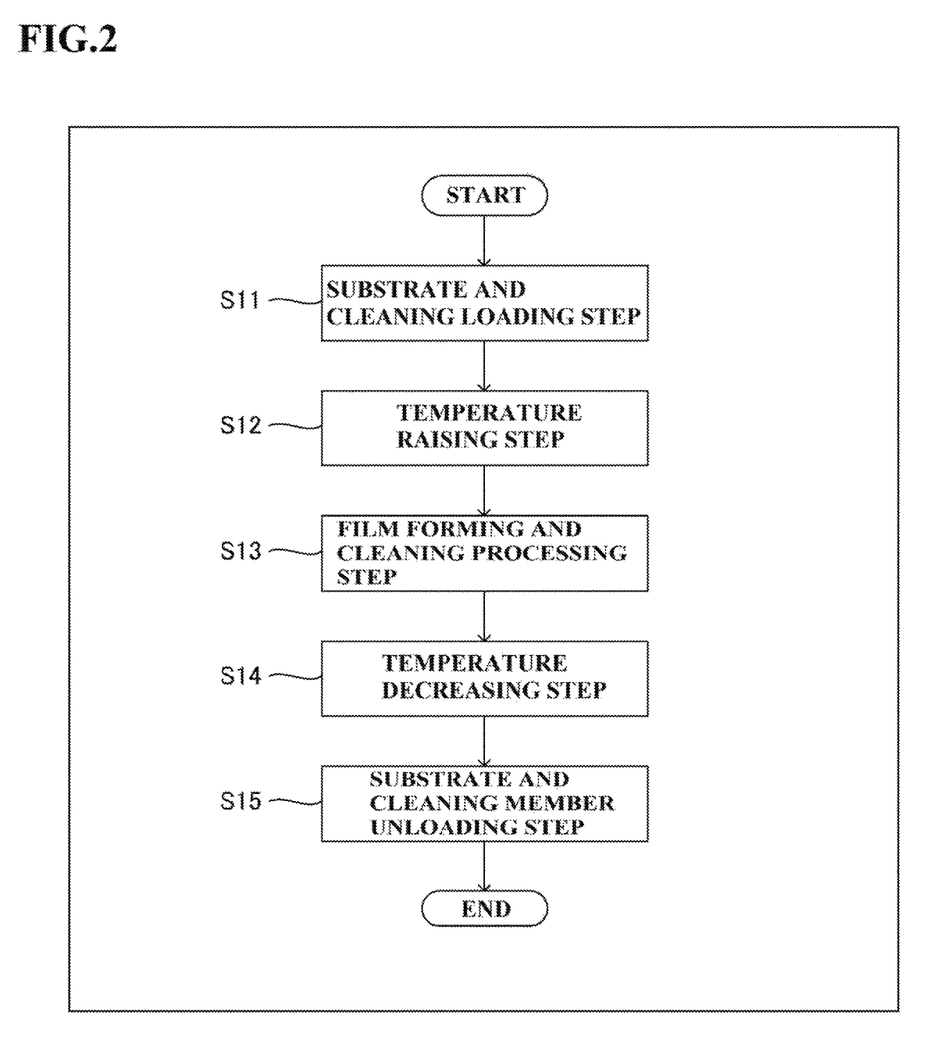
FIG. 2 is a flowchart showing an example of a basic procedure of a film forming and cleaning processing in a semiconductor manufacturing method according to an embodiment.

Next, a semiconductor manufacturing method according to an embodiment will be described, with reference to FIG. 2. In the semiconductor manufacturing method of this embodiment, the cleaning processing for removing semiconductors from the cleaning member 50 is performed simultaneously with the film forming processing for growing semiconductors on the substrate 30, using the above-mentioned HVPE device 1. FIG. 2 is a flowchart showing an example of a basic procedure of the film forming and cleaning processing of this embodiment. The operation of supplying each kind of gas to the gas supply system and the heating operation by the heater 14 are controlled by the controller 100.

(Film Forming and Cleaning Processing)

Hereinafter, a procedure of the film forming and cleaning processing according to an embodiment will be described separately in steps.

(Substrate and Cleaning Member Loading Step)

First, the substrate 30 and the cleaning member 50 are loaded into the reaction furnace 10 in the substrate and cleaning member loading step (step 11, hereinafter the step is abbreviated as "S").

The substrate 30 is, for example, a sapphire substrate, a sapphire substrate on which a GaN buffer layer is formed, or a sapphire substrate on which an AlN buffer layer is formed. After the holder 31 holding the substrate 30 is attached to the rotary shaft 32 of the flange 11b in a detached state, the flange 11b is attached to the reaction furnace 10, whereby the substrate 30 is set in the growth section 13a.

The cleaning member 50 is, for example, the holder 31 with semiconductors deposited thereon by being used for the previous film forming processing. Before attaching the flange 11b for setting the substrate 30, the cleaning member 50 is set in the cleaning section 13b, for example, by placing it on the bottom surface of the cleaning section 13b, with the reaction furnace 10 opened.

(Temperature Raising Step)

After the substrate 30 and the cleaning member 50 are set in the reaction furnace 10 in the substrate and cleaning member loading step (S11), a temperature raising step (S12) is performed after the atmosphere is evacuated from the inside of the reaction furnace 10, for example by supplying an inert gas.

In the temperature raising step (S12), the inside of the reaction furnace 10 is heated to a predetermined temperature by the heater 14. Specifically, the gas supply section 12 is heated up to, for example, about 850° C. by the upstream side heater 14a, and the growth section 13a and the cleaning section 13b are heated up to about 1000° C. by the downstream side heater 14b.

The temperature for heating the gas supply section 12 is selected so that a reaction is caused between Ga as the metal raw material 20 in a molten state and HCl gas as the chlorine-based gas, and GaCl gas can be generated as a chloride source gas (group III source gas).

The temperature for heating the growth section 13a and the cleaning section 13b is selected so that GaN can grow on the substrate 30 set in the growth section 13a. GaN can be etched with the chlorine-based gas (chlorine-containing gas) under a temperature condition in the vicinity of its growth temperature. Therefore, the temperature for heating the growth section 13a and the cleaning section 13b is a temperature suitable for semiconductors to grow on the substrate 30 set in the growth section 13a and also a temperature enabling the semiconductors to be removed and cleaned from the cleaning member 50 set in the cleaning section 13b.

(Film Forming and Cleaning Processing Step)

After the temperature raising step (S12), the film forming and cleaning processing step (S13) is then performed while maintaining a heating state to a predetermined temperature by the heater 14. In the film forming and cleaning processing step (S13), the source gas is supplied from the source gas supply system to the substrate 30 set in the growth section 13a, to thereby grow semiconductors on the substrate 30, and simultaneously the cleaning gas is supplied from the cleaning gas supply system to the cleaning member 50 set in the cleaning section 13b, to thereby remove the semiconductors from the cleaning member 50. More specifically, the film forming and cleaning processing step (S13) is performed as follows.

HCl gas as the chlorine-based gas for the raw material is supplied into the storage vessel 21 through the pipe 22. When HCl gas is supplied, Ga and HCl gas react in the storage vessel 21 to generate GaCl gas which is a metal chloride gas (chloride source gas). Then, GaCl gas is guided from the inside of the storage vessel 21 to the growth section 13a through the pipe 23 and is supplied to the substrate 30 set in the growth section 13a as the group III source gas.

Further, $NH_3$ gas as the group V source gas is supplied to the substrate 30 set in the growth section 13a through the pipe 24. As a result thereof, in the growth section 13a, GaCl gas which is the group III source gas and $NH_3$ gas which is the group V source gas are joined, and a GaN crystal grows on the substrate 30. By continuously performing such a crystal growth for a predetermined period of time, a GaN layer having a predetermined film thickness is formed on the substrate 30.

Simultaneously with GaN layer film forming processing on the substrate 30 in the growth section 13a, HCl gas as the chlorine-based gas for cleaning is supplied to the cleaning member 50 set in the cleaning section 13b through the pipe 25. As a result thereof, in the cleaning section 13b, cleaning is performed so that GaN deposited on the cleaning member 50 is removed.

In this manner, in the film forming and cleaning processing step (S13), the film forming processing step in the growth section 13a and the cleaning processing step in the cleaning section 13b are performed simultaneously.

As required, the cleaning processing step may be ended earlier or later than the film forming processing step, or may be started earlier or later than the film forming processing step. In other words, there is no need to completely coincide the processing periods between the film forming processing step and the cleaning processing step. The start and the end of the film forming processing step can be controlled by starting and ending the supply of the source gas. The start and the end of the cleaning processing step can be controlled by the start and the end of the supply of the cleaning gas independently of the control of the start and the end of the supply of the source gas. The cleaning processing step of a certain member can be performed over a plurality of film forming processing steps.

When GaCl gas and $NH_3$ gas are supplied to the substrate 30 set in the growth section 13a, the inert gas such as $H_2$ gas or $N_2$ gas, etc., or a mixed gas thereof may be supplied together as a carrier gas or a dilution gas through the pipes 22, 23, and 24.

(Temperature Decreasing Step)

After the film forming and cleaning processing step (S13) is performed, the temperature decreasing step (S14) is then performed. In the temperature decreasing step (S14), heating by the heater 14 is stopped, and the temperature in the reaction furnace 10 is naturally decreased.

(Substrate and Cleaning Member Unloading Step)

After the temperature of the inside of the reaction furnace 10 is decreased to, for example, a normal temperature in the temperature decreasing step (S14), subsequently the substrate and cleaning member unloading step (S15) is performed. In the substrate and cleaning member unloading step (S15), the holder 31 and the substrate 30 held by the holder 31 are taken out by detaching the flange 11b from the reaction furnace 10.

The holder 31 is detached from the rotary shaft 32 of the detached flange 11b, and the substrate 30 is detached from the holder 31. Further, the cleaning member 50 is taken out from the cleaning section 13b. In this manner, the substrate 30 already subjected to the film forming processing and the cleaning member 50 already subjected to the cleaning processing, are unloaded.

In this manner, the film forming and cleaning processing of a single time is performed. Thereafter, as required, the film forming and cleaning processing can be repeatedly performed multiple numbers of times, while exchanging the substrate 30 or the cleaning member 50.

For example, in the substrate and cleaning member unloading step, the holder 31 detached from the rotary shaft 32 (referred to as an already used holder 31 hereafter) is a cleaning member, due to semiconductors being deposited by the current film forming processing. On the other hand, the holder 31 selected as the cleaning member 50 in the current cleaning processing (referred to as an already cleaned holder 31 hereafter), is subjected to the cleaning processing and is cleaned.

The next film forming and cleaning processing can be performed using the already cleaned holder 31 in the current processing as the holder 31 for holding a new substrate 30 and also using the already used holder 31 in the current processing as the cleaning member 50.

As described above, the film forming and cleaning processing of this embodiment can be repeatedly performed while exchanging the already cleaned member which is cleaned and can be used for a new film forming processing and the already used cleaning member.

It is not essential to perform cleaning of the already used member in the film forming and cleaning processing of the next time of (immediately after) the time in which the cleaning member becomes the already used member, but may be performed in the film forming and cleaning processing of any one of the times after the time in which the cleaning member becomes the already used member. Further, it is not essential to reuse the already cleaned member in the film forming and cleaning processing of the next time of (immediately after) the time in which the cleaning member becomes the already cleaned member, but may be reused in the film forming and cleaning processing of any one of the times after the time in which the cleaning member becomes the already cleaned member.

One surface of the partition wall 40 is exposed to the growth section 13a side with semiconductors deposited thereon, and the opposite surface thereof is exposed to the cleaning section 13b side with semiconductors not deposited thereon (cleaned). Therefore, the partition wall 40 can be used with its surface reversed, so that a surface disposed on the growth section 13a side with semiconductors deposited thereon in a certain time of film forming and cleaning processing, is disposed on the cleaning section 13b side in the next time of film forming and cleaning processing and the deposits are cleaned. In this manner, one partition wall 40 can be efficiently used. A plurality of partition walls 40 may also be prepared and used like the holder 31 or the like while exchanging the already cleaned member and the cleaning member.

(3) Effect of this Embodiment

According to this embodiment, one or a plurality of effects described below can be obtained.

(a) In this embodiment, the inside of the reaction furnace 10 is divided into the growth section 13a and the cleaning section 13b by the partition wall 40. As a result thereof, the flow of the source gas supplied to the substrate 30 in the growth section 13a and the flow of the cleaning gas supplied to the cleaning member 50 in the cleaning section 13b can be separated from each other. Therefore, the film forming processing onto the substrate 30 in the growth section 13a and the cleaning processing for the cleaning member 50 in the cleaning section 13b can be simultaneously performed in the same semiconductor manufacturing device (in the same reaction furnace 10). In this manner, the cleaning processing can be efficiently performed.

For example, compared to a technique of performing the film forming processing and the cleaning (baking) processing performed without setting the substrate after the film forming processing, by the same semiconductor manufacturing device, efficiency of the processing is improved and the productivity is improved. Further, for example compared to a technique using a device (a baking device) that exclusively performs the cleaning processing in addition to the semiconductor manufacturing device that performs the film forming processing, required devices are reduced, and a cost reduction can be achieved.

(b) Regarding the position in the gas flow direction, preferably the downstream side end of the source gas supply system and the downstream side end of the cleaning gas supply system coincide with the upstream side end 40a of the partition wall 40, or disposed on the downstream side thereof. With such a configuration, the flow of the source gas can be more reliably separated from the flow of the cleaning gas.

(c) The heater 14 (downstream side heater 14b) simultaneously heats the growth section 13a and the cleaning section 13b. As a result thereof, heating necessary for the film forming processing (crystal growth) and heating required for the cleaning processing can be performed in common, and efficient heating is performed. Since it is not necessary to set the heater for heating the cleaning section 13b separately from the heater for heating the growth section 13a, there is no need for a cost of adding a heater for cleaning.

(d) The chlorine-based gas (HCl gas in the abovementioned example) used for generating the chloride source gas (GaCl gas in the abovementioned example) contained in the source gas used for the film formation by the HVPE method, is diverted and can be used as the cleaning gas. In other words, the same kind of chlorine-based gas as the chlorine-based gas used for generating the chloride source gas can be used as the cleaning gas. As a result thereof, the cleaning gas is not required to be prepared in addition to the gas used for the source gas. As required, the chlorine-based gas used for generating the chloride source gas and the chlorine-based gas used as the cleaning gas may be different kinds of gases.

(e) Although the film forming processing and the cleaning processing can be performed simultaneously, the start/end timing of the film forming processing and the start/end timing of the cleaning processing can be shifted as required. Whereby, suitable processing can be performed even when the times required for the film forming processing and the cleaning processing are different.

For example, when the cleaning processing is completed while the film forming processing is not yet ended and the supply of the cleaning gas continues even after removal of the deposits is completed, over-etching of the cleaning member may occur. In this case, the supply of the cleaning gas is stopped previously so that the cleaning processing step is ended. Whereby, troubles can be prevented. It should be noted that the member made of carbon or quartz is not easily over-etched by the cleaning gas of the chlorine-based gas.

(f) The member such as the holder 31, etc., can be used while exchanging the already cleaned member that can be used for a new film forming processing, and the already used cleaning member. Every time the film forming processing and the cleaning processing are completed, the already cleaned member can be prepared, which can be exchanged with the already used member. Therefore the productivity is improved.

(g) The partition wall 40 is detachably set in the reaction furnace 10, and one surface and the opposite surface thereof can be used by being reversed every time the film forming and cleaning processing is performed. As a result thereof, the clean surface is disposed on the growth section 13a side and can be used as a part of the inner wall of the growth section 13a, and the opposite surface surface with semiconductors deposited thereon, is disposed on the cleaning section 13b side and can be subjected to cleaning. In this manner, one partition wall 40 can be efficiently used.

(4) Other Embodiment

As described above, the present invention has been described with reference to an embodiment. However, the present invention is not limited to the abovementioned embodiment, and can be variously modified, improved, and combined in a range not departing from the gist of the invention.

For example, in the abovementioned embodiment, HCl gas is exemplified as the chlorine-based gas, but the chlorine-based gas is not limited to HCl gas, and other gases such as chlorine ($Cl_2$) gas, etc., for example can also be used.

In the abovementioned embodiment, particularly GaN is exemplified as the semiconductor to be grown and cleaned, but other Ga-based compound semiconductors such as GaAs and GaP, etc., can also be grown and cleaned. For example, GaAs and GaP can be grown and cleaned at a temperature of about 700° C. Further, the technique described in the abovementioned embodiments can be applied to the semiconductors such as InN, AlN, AlGaN, InGaN, etc., for example which can be grown by the HVPE method and which can be removed using the chlorine-based gas as the cleaning gas at a temperature equivalent to a growth temperature.

The cleaning member is not limited to the member such as the holder, etc., provided in the HVPE device itself that performs film forming and cleaning processing, but may be a member such as the one on which semiconductors are deposited due to crystal growth or the like in another device.

DESCRIPTION OF SIGNS AND NUMERALS

1 HVPE device
10 Reaction furnace
10a Protrusion
11a, 11b Flange
12 Downstream section (Gas supply section)
13 Upstream section
13a Growth section
13b Cleaning section
14 Heater
14a Upstream side heater
14b Downstream side heater
20 Metal raw material
21 Storage vessel
22, 23, 24, 25 Pipe
23a, 24a, 25a Nozzle
30 Substrate
31 Holder
32 Rotary shaft
40 Partition wall
50 Cleaning member
60 Gas supply source
100 Controller

The invention claimed is:

1. A semiconductor manufacturing device, comprising:
a processing vessel;
a partition wall that divides at least a part of a space in the processing vessel into a growth section and a cleaning section;
a substrate holding member disposed in the growth section;
a source gas supply system that supplies a source gas into the growth section;
a cleaning gas supply system that supplies a cleaning gas into the cleaning section; and
a heater that heats the growth section and the cleaning section,
wherein a downstream side end of the source gas supply system and a downstream side end of the cleaning gas supply system coincide with an upstream side end of the partition wall or disposed on a downstream side thereof, regarding a position of a gas flow direction.

2. The semiconductor manufacturing device according to claim 1, wherein the partition wall is set in the reaction vessel so that a surface exposed to the growth section side and a surface exposed to the cleaning section side can be reversed.

3. The semiconductor manufacturing device according to claim 1,
wherein the source gas supply system has a chloride source gas generating section that generates a chloride source gas using a chlorine-based gas, and
the cleaning gas supply system is commonly connected to a supply source of the chlorine-based gas used in the chloride source gas generating section.

4. A semiconductor manufacturing method, using a semiconductor manufacturing device comprising:
a processing vessel;
a partition wall that divides at least a part of a space in the processing vessel into a growth section and a cleaning section;
a substrate holding member disposed in the growth section;
a source gas supply system that supplies a source gas into the growth section;
a cleaning gas supply system that supplies a cleaning gas into the cleaning section; and
a heater that heats the growth section and the cleaning section,
the method comprising the steps of:
supplying the source gas from the source gas supply system to a substrate held by the substrate holding member disposed in the growth section to grow semiconductors on the substrate, and simultaneously supplying the cleaning gas from the cleaning gas supply system to a cleaning member disposed in the cleaning section to remove the semiconductors deposited on the cleaning member, in a state where the growth section and the cleaning section are heated by the heater,
wherein the steps are performed multiple numbers of times while exchanging a substrate and a cleaning member, and
the partition wall is used with a surface exposed to the growth section side and a surface exposed to the cleaning section side being reversed.

5. The semiconductor manufacturing method according to claim 4, for performing the step multiple numbers of times while exchanging a substrate and a cleaning member,
wherein a plurality of the same kind of members are detachably prepared as a member disposed at a position in the processing vessel where semiconductors are deposited, and among these members, the member already used in the step of a certain time and having semiconductors deposited thereon, is selected as a cleaning member in the step performed after the time in which the cleaning member becomes the already used member, and the member already cleaned is reused in the step performed after the time in which the cleaning member becomes the already cleaned member.

6. The semiconductor manufacturing method according to claim 4, wherein in the step, a chloride source gas contained in the source gas is generated using a chlorine-based gas, and a chlorine-based gas of the same kind as the chlorine-based gas used for generating the chloride source gas is used as the cleaning gas.

7. A semiconductor manufacturing device, comprising:

a processing vessel;

a partition wall that divides at least a part of a space in the processing vessel into a growth section and a cleaning section;

a substrate holding member disposed in the growth section;

a source gas supply system that supplies a source gas into the growth section;

a cleaning gas supply system that supplies a cleaning gas into the cleaning section; and a heater that heats the growth section and the cleaning section, wherein the partition wall is set in the reaction vessel so that a surface exposed to the growth section side and a surface exposed to the cleaning section side can be reversed.

8. The semiconductor manufacturing device according to claim 7, wherein the source gas supply system has a chloride source gas generating section that generates a chloride source gas using a chlorine-based gas, and the cleaning gas supply system is commonly connected to a supply source of the chlorine-based gas used in the chloride source gas generating section.

\* \* \* \* \*